US008691690B2

(12) United States Patent
Amoah et al.

(10) Patent No.: US 8,691,690 B2
(45) Date of Patent: Apr. 8, 2014

(54) CONTACT FORMATION METHOD INCORPORATING PREVENTATIVE ETCH STEP REDUCING INTERLAYER DIELECTRIC MATERIAL FLAKE DEFECTS

(75) Inventors: Yoba Amoah, Fairfax, VT (US); Brian M. Czabaj, Essex Junction, VT (US); Thomas J. Dunbar, Burlington, VT (US); Jeffrey P. Gambino, Westford, VT (US); Molly J. Leitch, Rocky River, OH (US); Polina A. Razina, Amherst, MA (US)

(73) Assignee: International Business Machines Corporation, Armonk, NY (US)

( * ) Notice: Subject to any disclaimer, the term of this patent is extended or adjusted under 35 U.S.C. 154(b) by 730 days.

(21) Appl. No.: 12/880,437

(22) Filed: Sep. 13, 2010

(65) Prior Publication Data

US 2012/0064714 A1    Mar. 15, 2012

(51) Int. Cl.
*H01L 21/768*    (2006.01)
(52) U.S. Cl.
USPC ........... 438/654; 438/584; 438/597; 438/618; 438/622; 438/675; 257/E21.597; 257/E21.585
(58) Field of Classification Search
None
See application file for complete search history.

(56) References Cited

U.S. PATENT DOCUMENTS

| | | | |
|---|---|---|---|
| 5,227,335 A | 7/1993 | Holschwandner et al. | |
| 5,562,801 A | 10/1996 | Nulty | |
| 5,654,234 A | 8/1997 | Shih et al. | |
| 5,783,097 A | 7/1998 | Lo et al. | |
| 5,783,482 A * | 7/1998 | Lee et al. | 438/624 |
| 5,810,936 A | 9/1998 | Leung et al. | |
| 6,103,623 A * | 8/2000 | Lien et al. | 438/669 |
| 6,146,991 A * | 11/2000 | Cheng et al. | 438/622 |
| 6,214,722 B1 * | 4/2001 | Lin et al. | 438/637 |
| 6,407,002 B1 * | 6/2002 | Lin et al. | 438/713 |
| 6,420,099 B1 | 7/2002 | Gutsche et al. | |
| 6,974,756 B2 | 12/2005 | Yim | |
| 7,501,690 B2 * | 3/2009 | Erturk et al. | 257/508 |
| 7,517,754 B2 | 4/2009 | McDaniel et al. | |

(Continued)

FOREIGN PATENT DOCUMENTS

JP    07-115083    2/1995

OTHER PUBLICATIONS

IBM, IPCOM000177083D, Dec. 4, 2008.

(Continued)

*Primary Examiner* — Zandra Smith
*Assistant Examiner* — Khanh Duong
(74) *Attorney, Agent, or Firm* — Gibb & Riley, LLC; Richard M. Kotulak, Esq.

(57) ABSTRACT

Disclosed are embodiments of a contact formation technique that incorporates a preventative etch step to reduce interlayer dielectric material flaking (e.g., borophosphosilicate glass (BPSG) flaking) and, thereby to reduce surface defects. Specifically, contact openings, which extend through a dielectric layer to semiconductor devices in and/or on a center portion of a substrate, can be filled with a conductor layer deposited by chemical vapor deposition (CVD). Chemical mechanical polishing (CMP) of the conductor layer can be performed to complete the contact structures. However, before the CMP process is performed (e.g., either before the contact openings are ever formed or before the contact openings are filled), a preventative etch process can be performed to remove any dielectric material from above the edge portion of the substrate. Removing the dielectric material from above the edge portion of the substrate prior to CMP reduces the occurrence of surface defects caused by dielectric material flaking.

11 Claims, 15 Drawing Sheets

(56) References Cited

U.S. PATENT DOCUMENTS

| | | | |
|---|---|---|---|
| 7,897,425 B2 * | 3/2011 | Baek et al. | 438/57 |
| 8,252,665 B2 * | 8/2012 | Chiou et al. | 438/459 |
| 2002/0190379 A1 | 12/2002 | Jian et al. | |
| 2003/0091870 A1 | 5/2003 | Bhowmik et al. | |
| 2004/0067654 A1 | 4/2004 | Chen et al. | |
| 2007/0228010 A1 | 10/2007 | Martin et al. | |

OTHER PUBLICATIONS

Okazaki et al., "Wafer Edge Polishing Process for Defect Reduction During Immersion Lithography," Applied Materials, 3050 Bowers Avenue, Santa Clara, CA 95052, USA.

* cited by examiner

US 8,691,690 B2

CONTACT FORMATION METHOD INCORPORATING PREVENTATIVE ETCH STEP REDUCING INTERLAYER DIELECTRIC MATERIAL FLAKE DEFECTS

BACKGROUND

1. Field of the Invention

The embodiments relate to back end of the line (BEOL) processing of semiconductor wafers and, more specifically, to a contact formation method that incorporates a preventative etch step for reducing interlayer dielectric material (e.g., borophosphosilicate glass (BPSG)) flake defects.

2. Description of the Related Art

Current back end of the line (BEOL) contact formation techniques and, more specifically, current BEOL tungsten (W) plug formation techniques can result in the flaking of borophosphosilicate glass (BPSG) interlayer dielectric material at the edge of a semiconductor wafer and, thereby can result in surface defects. More particularly, tungsten (W) is commonly used to fill contact openings, which extend vertically through a BPSG layer to a semiconductor substrate. Tungsten (W) is typically deposited by chemical vapor deposition (CVD) using tungsten hexafluoride ($WF_6$) gas. Unfortunately, $WF_6$ gas can also etch any exposed semiconductor material within the contact openings. To avoid such etching, a protective liner is deposited in the contact openings prior to tungsten (W) deposition. While this protective liner is generally sufficient to protect the semiconductor material within any contact openings that are patterned above the center portion of the substrate, oftentimes it is insufficient to protect the semiconductor material within contact openings that are patterned above the edge portion of the substrate (i.e., near the wafer's edge). As a result, the semiconductor material within the contact openings near the wafer's edge is etched, creating voids and undercutting the BPSG layer. Such voids reduce BPSG layer adhesion, causing BPSG flaking and, thereby creating surface defects.

Therefore, there is a need in the art for a back end of the line (BEOL) processing technique that prevents contact level defects and, more particularly, a BEOL processing technique that prevents BPSG flaking, which creates contact-level surface defects.

SUMMARY

In view of the foregoing, disclosed herein are embodiments of a contact formation technique that incorporates a preventative etch step to reduce interlayer dielectric material flaking (e.g., borophosphosilicate glass (BPSG) flaking) and, thereby to reduce surface defects. Specifically, contact openings, which extend through dielectric material to semiconductor devices in and/or on the center portion of a substrate, can be filled with a conductor layer (e.g., a tungsten layer) deposited by chemical vapor deposition (CVD). Chemical mechanical polishing (CMP) of the conductor layer can be performed to complete the contact structures. However, before the CMP process is performed (e.g., either before the contact openings are ever formed or before the contact openings are filled), a preventative etch process can be performed to remove any dielectric material from above the edge portion of the substrate. Removing the dielectric material from above the edge portion of the substrate prior to CMP reduces the occurrence of surface defects caused by dielectric material flaking.

More particularly, one embodiment of a contact formation method comprises providing a semiconductor substrate, having a center portion and an edge portion positioned laterally around the center portion. Semiconductor devices can be formed in and/or on the center portion of the substrate and at least one dielectric layer can be formed above the substrate such that it extends laterally across both the center and edge portions. For example, a conformal nitride layer can be formed on the substrate and a blanket borophosphosilicate glass (BPSG) layer can be formed on the conformal nitride layer. Openings can be formed through the dielectric layer(s) (e.g., through the BPSG layer and nitride layer) to the substrate. Specifically, these openings can comprise a plurality of first openings extending vertically through the dielectric layer(s) to the semiconductor devices in the center portion of the substrate and at least one second opening extending vertically through the dielectric layer(s) to the edge portion of the substrate. Optionally, after the openings are formed, a protective liner that lines the openings can be formed. Next, a conductor layer (e.g., a tungsten layer) can be formed (e.g., by CVD) on the protective liner such that it is positioned above the center portion of the substrate, filling the first openings, and further such that it does not extend laterally over the edge portion of the substrate. After the conductor layer is formed, an etch process can be performed to remove any dielectric material from above the edge portion of the substrate and, thereby expose the edge portion of the substrate. During this etch process, the conductor layer can be used as a mask because, as mentioned above, it is formed so that it does not extend to the wafer's edge. After this etch process is performed, a chemical mechanical polishing (CMP) process can be performed to expose the top surface of the uppermost dielectric layer (e.g., the top surface of the BPSG layer) and complete the contact structures. Performing the CMP only after the dielectric material and, particularly, the BPSG, has been removed from above the edge portion of the substrate reduces the occurrence of dielectric material flaking (e.g., BPSG flaking) near the wafer's edge and, thereby reduces the occurrence of surface defects.

Another embodiment of a contact formation method similarly comprises providing a semiconductor substrate, having a center portion and an edge portion positioned laterally around the center portion. Semiconductor devices can be formed in and/or on the center portion of the substrate and at least one dielectric layer can be formed above the substrate such that it extends laterally across both the center and edge portions. For example, a conformal nitride layer can be formed on the substrate and a blanket borophosphosilicate glass (BPSG) layer can be formed on the conformal nitride layer. A photoresist layer can be formed on the top surface of the dielectric layer(s) (e.g., on the top surface of the BPSG layer). Then, the photoresist layer can be patterned with a plurality of openings above the center portion of the substrate and further patterned so as to expose the top surface of the uppermost dielectric layer (e.g., the top surface of the BPSG layer) above the entire edge portion of the substrate. Next, an etch process can be performed, using the photoresist layer as a mask, in order to extend the openings through the dielectric layer(s) (e.g., through the BPSG and nitride layers) to the semiconductor devices in the center portion of the substrate and further to expose the edge portion of the substrate. That is, the patterned photoresist layer, which has openings above the center portion and which does not extend laterally to the wafer's edge, can be used as a mask during this etch process to simultaneously form the openings to the semiconductor devices in the center portion of the substrate and to remove any dielectric material from above the edge portion of the substrate. After this etch process is performed, the patterned photoresist layer can be removed. Optionally, a protective liner can be formed on the remaining portion of the dielectric layer(s) (e.g., on the remaining portion of the BPSG) layer so as to line the openings. Then, a conductor layer (e.g., a tungsten layer) can be formed (e.g., by CVD) on the protective liner such that it fills the openings. After the conductor layer is formed, a chemical mechanical polishing (CMP) process can be performed to expose the top surface of the uppermost dielectric layer (e.g., the top surface of the BPSG layer) and complete the contact structures. Depositing the conductor layer and performing the CMP only after the dielectric material and, particularly, the BPSG, has been removed from above the edge portion of the substrate reduces the occurrence of dielectric material flaking (e.g., BPSG flaking) near the wafer's edge and, thereby reduces the occurrence of surface defects.

BRIEF DESCRIPTION OF THE SEVERAL VIEWS OF THE DRAWINGS

The embodiments of the invention will be better understood from the following detailed description with reference to the following figures, which are not necessarily drawn to scale and in which.

DETAILED DESCRIPTION

The embodiments of the invention and the various features and advantageous details thereof are explained more fully with reference to the non-limiting embodiments that are illustrated in the accompanying drawings and detailed in the following description.

As mentioned above and illustrated in FIGS. 1A-1E, current back end of the line (BEOL) contact formation techniques and, more specifically, current BEOL tungsten (W) plug formation techniques can result in the flaking of borophosphosilicate glass (BPSG) interlayer dielectric material at the edge of a semiconductor wafer and, thereby can result in surface defects.

Figure 1A:
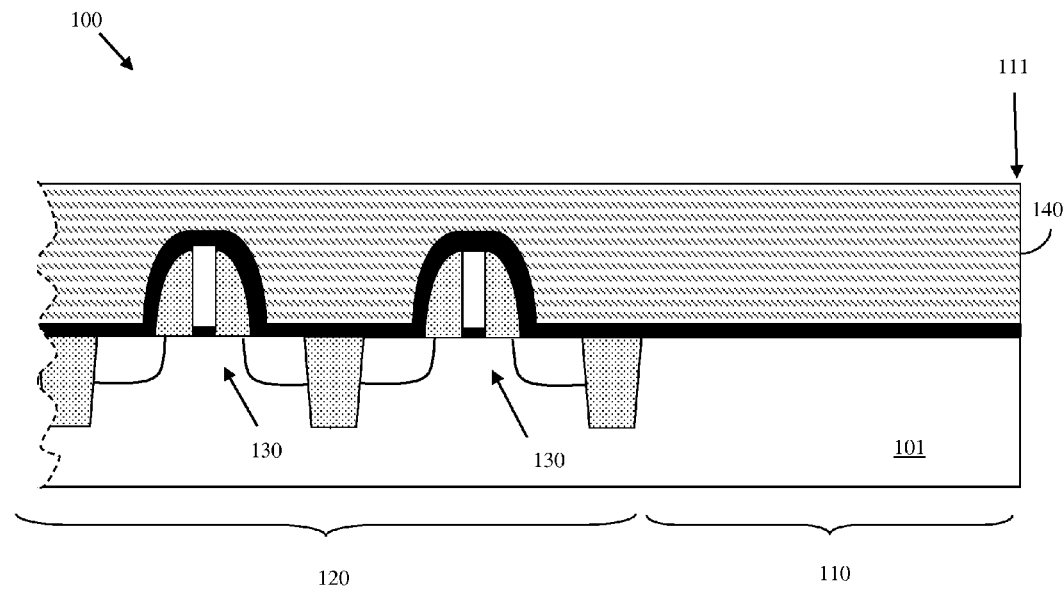
FIG. 1A is a cross-section diagram illustrating a portion of a semiconductor wafer prior to back end of the line (BEOL) contact formation processing.

More particularly, FIG. 1A illustrates a semiconductor wafer 100 immediately prior to conventional BEOL processing. Specifically, the semiconductor wafer 100 comprises a semiconductor substrate 101 and a plurality of semiconductor devices 130 in and/or on the center portion 120 of the substrate 101. A blanket layer 140 of an interlayer dielectric material (e.g., a blanket borophosphosilicate glass (BPSG) layer) covers the substrate 101. That is, the BPSG layer 140 extends across the center portion 120 of the substrate 101 over the semiconductor devices 130 and also across the edge portion 110 of the substrate 101, which is immediately adjacent to the wafer's edge 111 and within which active semiconductor devices 130 are not formed.

Figure 1B:
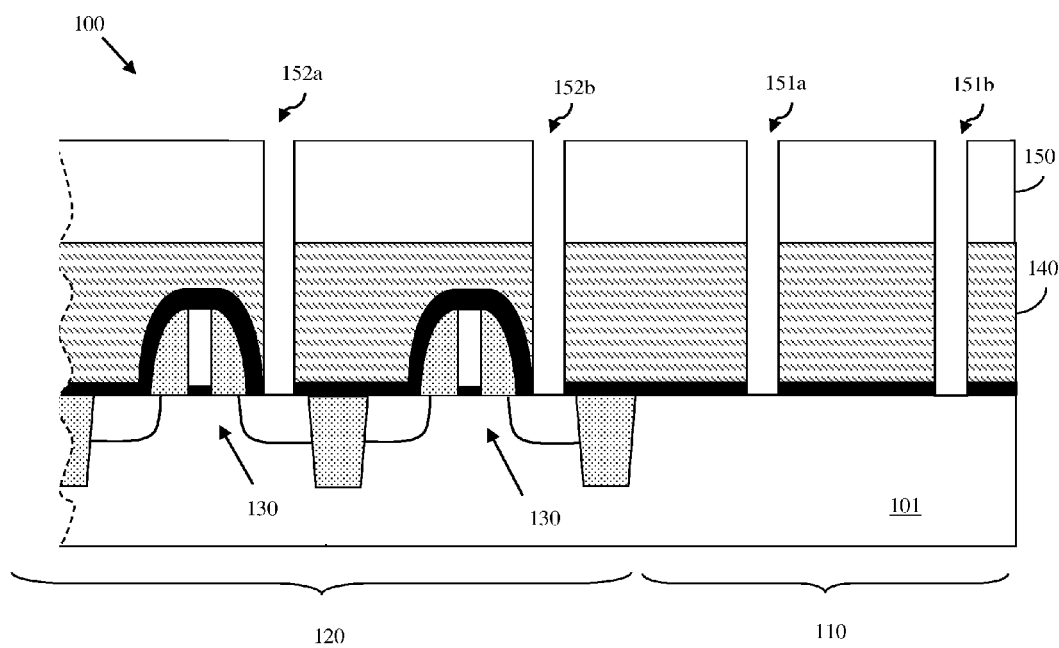
FIG. 1B is a cross-section diagram illustrating the portion of the semiconductor wafer of FIG. 1A following a BEOL contact formation process step.
Figure 1C:
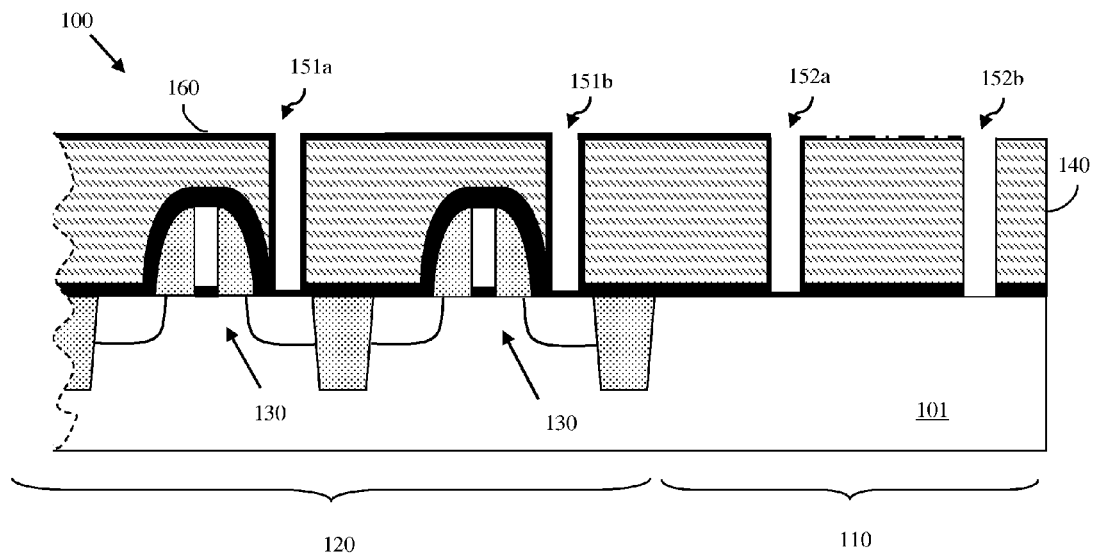
FIG. 1C is a cross-section diagram illustrating the portion of the semiconductor wafer of FIG. 1A following another BEOL contact formation process step.
Figure 1D:
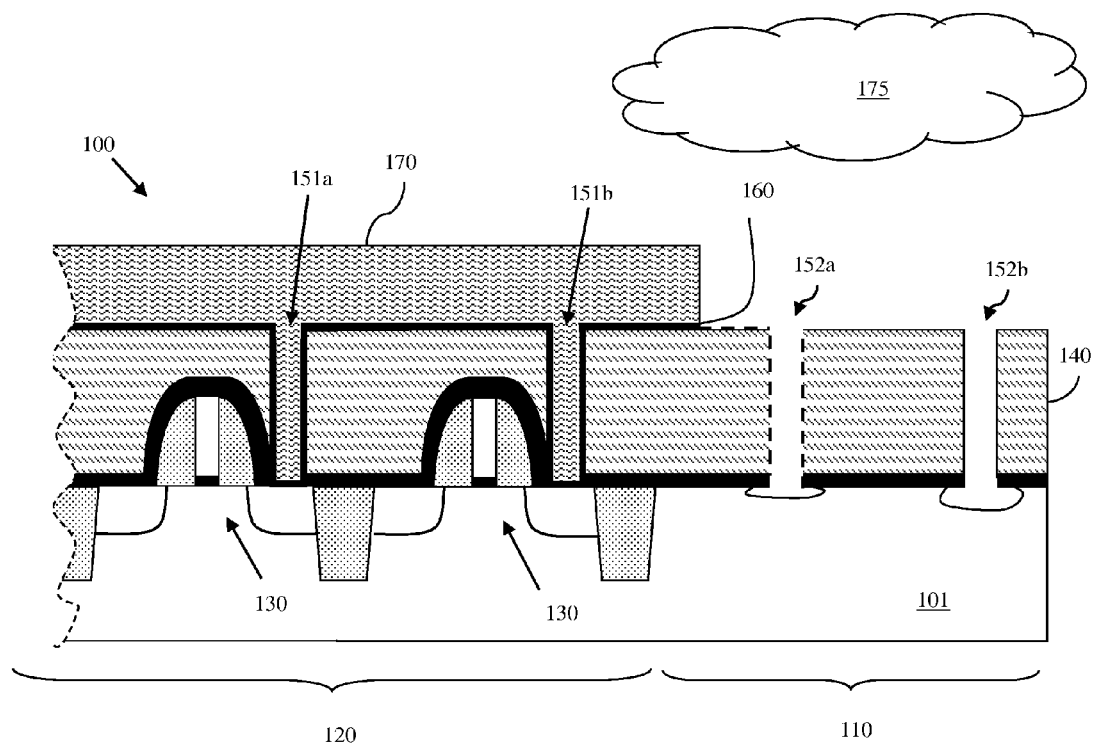
FIG. 1D is a cross-section diagram illustrating the portion of the semiconductor wafer of FIG. 1A following another BEOL contact formation process step.
Figure 1E:
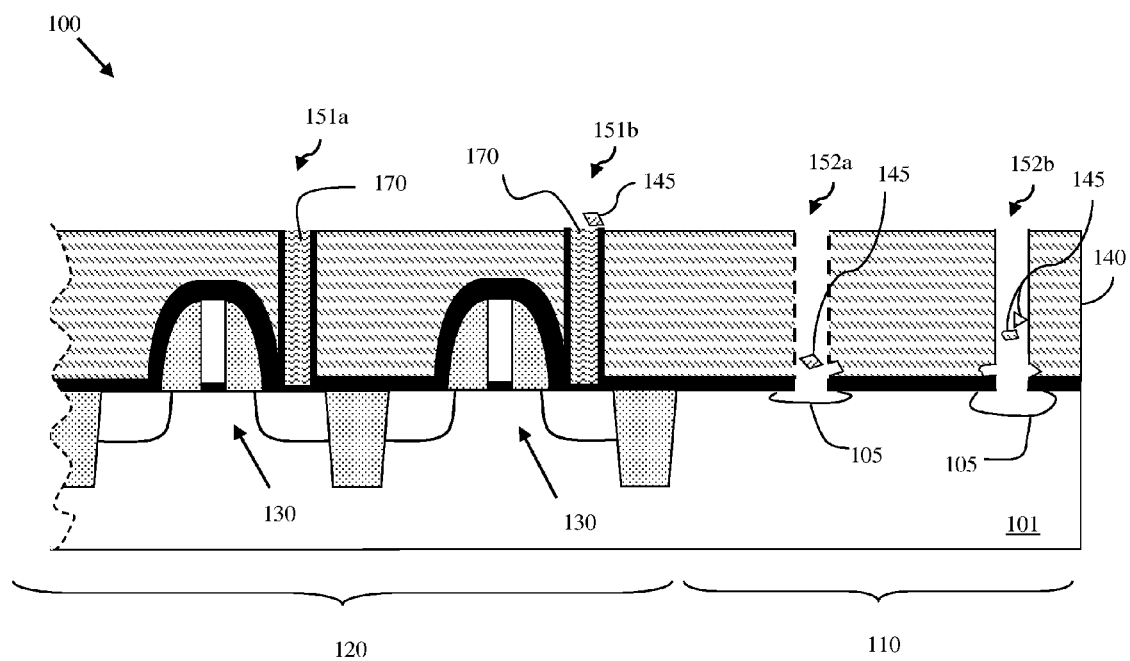
FIG. 1E is a cross-section diagram illustrating the portion of the semiconductor wafer of FIG. 1A following another BEOL contact formation process step.

During the initial stages of conventional BEOL processing, the devices 130 are interconnected through contact and metal level formation. As illustrated in FIG. 1B, contact formation begins with the deposition and patterning of a photoresist layer 150 on the BPSG layer 140. The patterned photoresist layer 150 is used as a mask during an etch process to form contact openings 152a-b through the BPSG layer 140 to the devices 130. However, typically the photoresist layer 150 is patterned such that, during this same etch process, additional openings 151a-b are also formed through the BPSG layer 140 to the edge portion 110 of the substrate 101 (e.g., to the outermost 0.5-2.0 mm portion of the substrate 101 immediately adjacent to the wafer's edge 111). After the openings 152a-b, 151a-b are formed, they are filled with a suitable conductor material 170 (e.g., tungsten) to form functional and non-functional contacts, respectively. Tungsten is typically deposited by chemical vapor deposition (CVD) using tungsten hexafluoride ($WF_6$) gas. Unfortunately, during tungsten deposition by CVD, the $WF_6$ gas also etches any exposed semiconductor material (e.g., exposed semiconductor substrate 101 at the bottom surface of the openings 151a-b,152a-b). One proposed solution to avoid such unwanted etching is to deposit a conformal protective liner 160 (e.g., as shown in FIG. 1C) prior to depositing tungsten 170 (e.g., as shown in FIG. 1D).

While the conformal protective liner 160 effectively prevents etching of the semiconductor material at the bottom surface of the openings 152a-b above the center portion 120 of the substrate 101, oftentimes it is insufficient to protect the semiconductor material at the bottom surface of the openings 151a-b above the edge portion 110 of the substrate 101. Specifically, as a function of the tool used for CVD of tungsten, tungsten 170 may be deposited above the center portion 120 only of the substrate 101 and not above the edge portion 110 (e.g., not above the outermost 0.5-2.0 mm portion of the substrate 101 immediately adjacent to the wafer's edge 111). Additionally, $WF_6$ gas 175 may build up near the wafer's edge 111. Thus, during tungsten deposition by CVD, the openings 152a-b above the edge portion 110 of the substrate 101 may be subjected to prolonged exposure to significant amounts $WF_6$ gas 175. If the protective liner 160 is deposited such that it does not extend laterally to the wafer's edge 111 (e.g., see unlined opening 151b, as shown in FIG. 1C), then the semiconductor material within the unlined opening 151b will be damaged due to direct exposure to the $WF_6$ gas 175 (e.g., see void 105 created in substrate 101 below the opening 151b, as shown in FIG. 1D). Additionally, even if the protective liner 160 is deposited such that it is above all or some of the edge portion 110 of the substrate 101 (e.g., see lined opening 151a, as shown in FIG. 1C), prolonged exposure of the protective liner 160 to $WF_6$ gas 175 can damage the protective liner 160 and, in turn, the semiconductor material at the bottom surface of the opening 151a (e.g., see void 105 created in substrate 101 below the line opening 151a, as shown in FIG. 1D). These voids 105 reduce BPSG layer 140 adhesion and, consequently, during chemical mechanical polishing (CMP) of the tungsten layer 170 or other subsequent processes, the BPSG layer 140 flakes (e.g., see flakes 145) near the interface with the substrate 101. These BPSG layer flakes 145 can in turn create surface defects. For example, if the land on the top surface of a completed contact structure they can create an open.

In view of the foregoing, disclosed herein are embodiments of a back end of the line (BEOL) contact formation technique and, particularly, a tungsten contact formation technique (i.e., a tungsten plug formation technique) that incorporates a preventative etch step to reduce interlayer dielectric material flaking (e.g., borophosphosilicate glass (BPSG) flaking) and, thereby to reduce surface defects. Specifically, contact openings, which extend through dielectric material to semiconductor devices in and/or on the center portion of a substrate, can be filled with a conductor layer (e.g., a tungsten layer) deposited by chemical vapor deposition (CVD). Chemical mechanical polishing (CMP) of the conductor layer can be performed to complete the contact structures. However, before the CMP process is performed (e.g., either before the contact openings are ever formed or before the contact openings are filled), a preventative etch process can be performed to remove any dielectric material from above the edge portion of the substrate. Removing the dielectric material from above the edge portion of the substrate prior to CMP reduces the occurrence of surface defects caused by dielectric material flaking.

Figure 2:
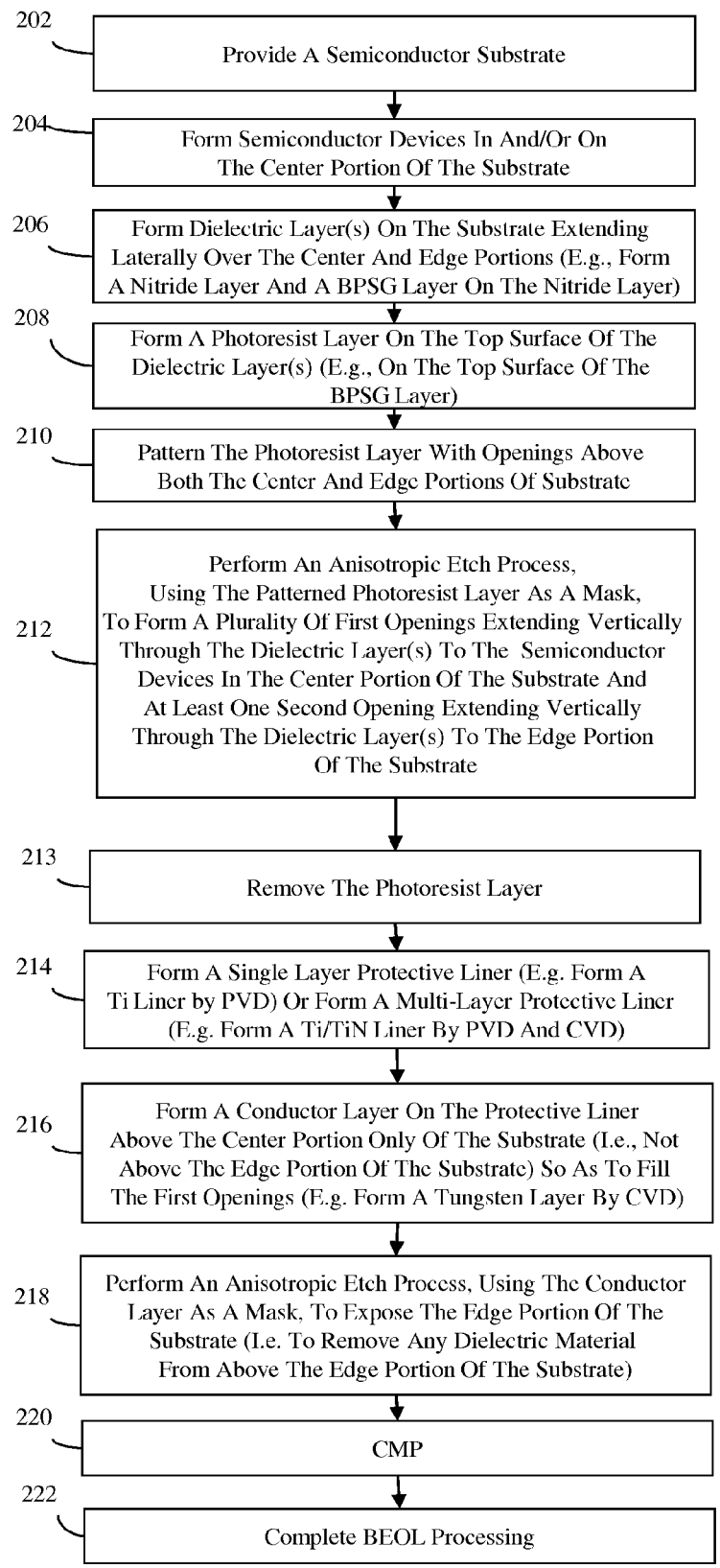
FIG. 2 is a flow diagram illustrating an embodiment of a BEOL contact formation method according to the present invention.
Figure 3A:
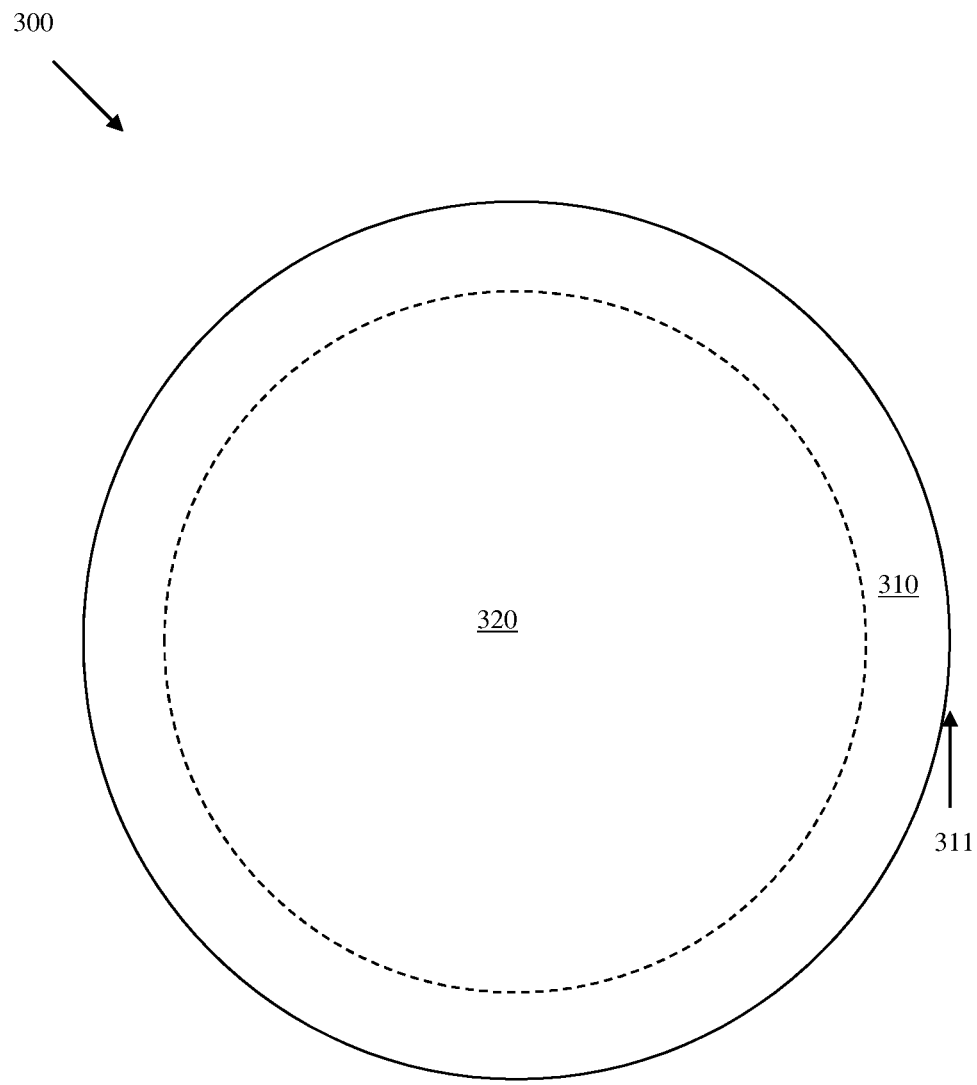
FIG. 3A is a top view diagram illustrating a semiconductor wafer.

More particularly, referring to FIG. 2, one embodiment of a contact formation method (e.g., a tungsten contact or tungsten plug formation method) comprises providing a semiconductor wafer 300 (202, see FIG. 3A). This wafer 300 can comprise a semiconductor substrate 301 comprising, for example, a bulk silicon substrate, a silicon-on-insulator (SOI) substrate, or any semiconductor substrate suitable for semiconductor device formation. The substrate 301 can have a center portion 320 and an edge portion 310 positioned laterally around the center portion 320 and extending to the wafer's edge 311. This edge portion 310 can comprise, for example, the outermost 0.5-2.0mm portion of the substrate 301 immediately adjacent to the wafer's edge 311. Functioning semiconductor devices 330 (e.g., planar field effect transistors (FETs) (as shown), non-planar FETs, bipolar transistors (BTs), heterojunction bipolar transistors (HBTs), diodes, resistors, capacitors, or any other semiconductor device) can be formed in and/or on the center portion 320 only of the substrate 301 (204, see FIG. 3B). Processes for forming such devices 330 on semiconductor wafers are well-known in the art and, thus, the details of such processes are omitted from this specification to allow the reader to focus on the salient aspects of the invention.

Figure 3B:
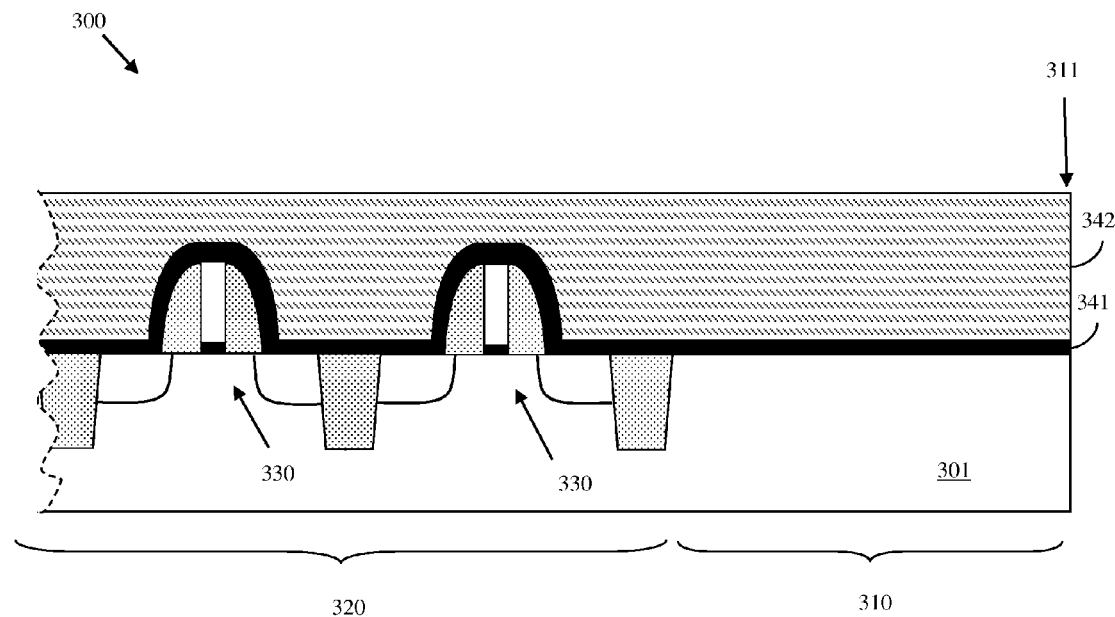
FIG. 3B is a cross-section diagram illustrating a portion of the semiconductor wafer of FIG. 3A prior to BEOL contact formation processing according to the method of FIG. 2.

Next, at least one dielectric layer can be formed above the substrate 301, extending laterally across both the center and edge portions (206, see dielectric layers 341-342 of FIG. 3B). For example, a conformal silicon nitride layer 341 can be formed (e.g., by a low-pressure chemical vapor deposition LPCVD)) on the substrate 301 and a blanket borophosphosilicate glass (BPSG) layer 342 can be formed (e.g., also by LPCVD) on the conformal silicon nitride layer.

Figure 3C:
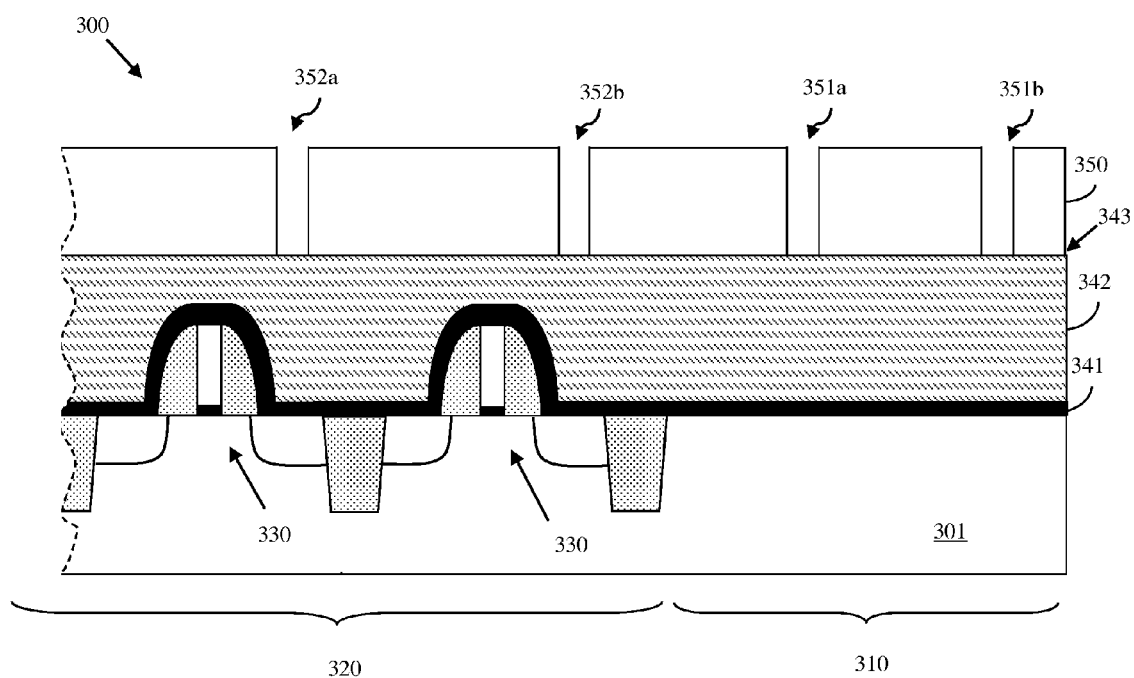
FIG. 3C is a cross-section diagram illustrating the portion of the semiconductor wafer of FIG. 3B following a BEOL contact formation process step according to the method of FIG. 2.

After the dielectric layer(s) are formed at process 206, openings 351a-b and 352a-b can be formed through the dielectric layer(s) 341-342 (e.g., through the BPSG layer 342 and nitride layer 341) to the substrate 301. Specifically, a photoresist layer 350 can be deposited onto the top surface 343 of the uppermost dielectric layer 342 (e.g., onto the top surface of the BPSG layer 342) and, then, patterned with a plurality of openings 352a-b, 351a-b using, for example, conventional lithographic patterning techniques (208-210, see FIG. 3C). These openings can be patterned above the center portion 320 of the substrate 301 and aligned with the semiconductor devices 330 (see first openings 352a-b) and above the edge portion 310 of the substrate 301 (see second openings 351a-b). Additionally, these openings 352a-b, 351a-b can be patterned to have diameter corresponding to the desired diameter for the device contacts (e.g., a diameter of 0.05-0.5 microns (μm)).

Figure 3D:
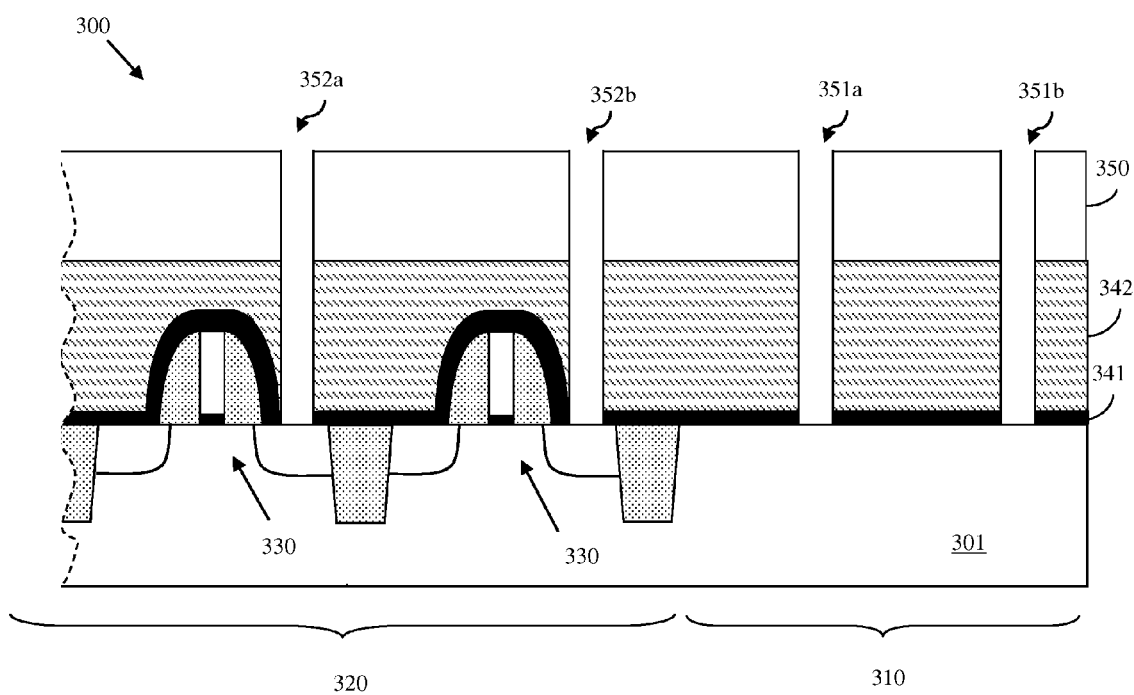
FIG. 3D is a cross-section diagram illustrating the portion of the semiconductor wafer of FIG. 3B following another BEOL contact formation process step according to the method of FIG. 2.

Next, an etch process can be performed (212, see FIG. 3D). Specifically, an anisotropic etch process (e.g., a reactive ion etch (RIE) process) can be performed so as to extend the first openings 352a-b through the dielectric layer(s) 341-342 to the semiconductor devices 330 in the center portion 320 of the substrate 301 and to simultaneously extend the second openings 351a-b through the dielectric layer(s) 341-342 to the edge portion 310 of the substrate 301. It should be understood that multiple selective anisotropic RIE processes may be required to etch through multiple different dielectric layers 341-342 stopping on the substrate 301. Following this etch process 212, the photoresist layer 350 can be selectively removed (213).

Figure 3E:
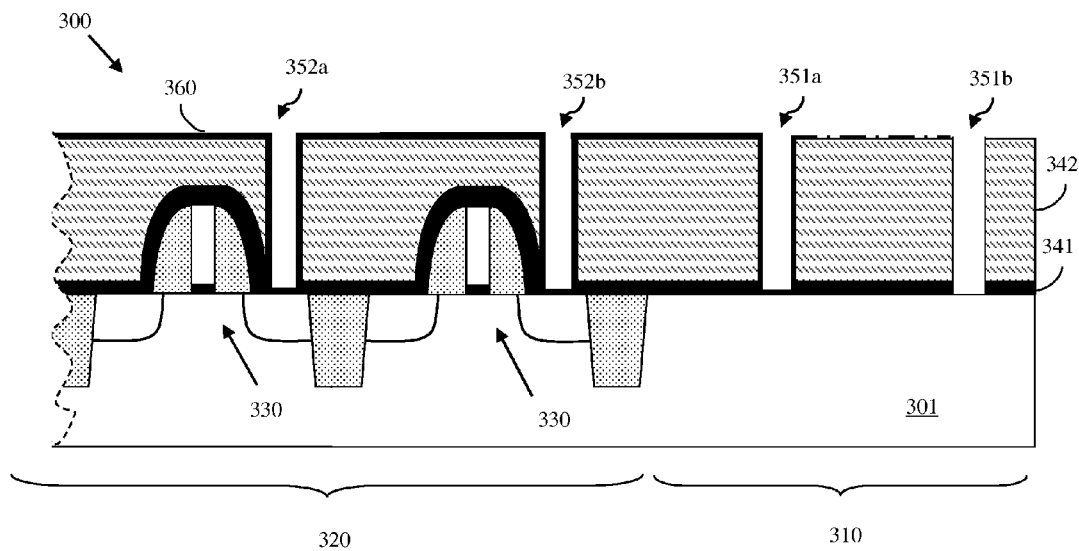
FIG. 3E is a cross-section diagram illustrating the portion of the semiconductor wafer of FIG. 3B following another BEOL contact formation process step according to the method of FIG. 2.

Optionally, after the openings 352a-b, 351a-b are extended through the dielectric layer(s) 341-342 and the photoresist layer is removed at processes 212-213, a protective liner 360 can be formed that at least lines the openings 352a-b above the center portion 320 of the substrate 301 (214, see FIG. 3E). The process 214 of forming the protective liner 360 can optionally comprise forming a multi-layer protective liner. For example, a titanium layer can be formed (e.g., by plasma vapor deposition (PVD)) on the top surface of the uppermost dielectric layer 342 (e.g., on the top surface of the BPSG layer) and further on the sidewalls and bottom surfaces of at least the openings 352a-b. This titanium layer can function as an adhesion layer, enhancing adhesion between the dielectric layer(s) 341-342 and a conductor layer which will subsequently fill the openings. Next, a titanium nitride layer can be formed (e.g., by chemical vapor deposition (CVD) on the titanium layer. This titanium nitride layer can function as a diffusion barrier layer.

Figure 3F:
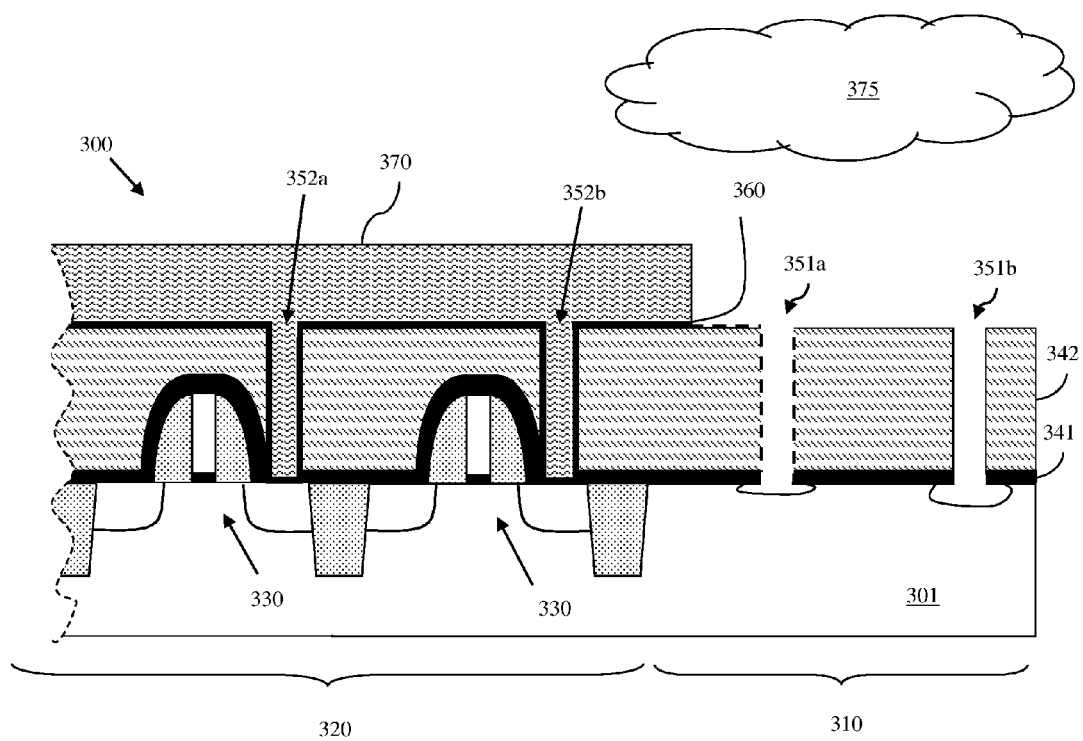
FIG. 3F is a cross-section diagram illustrating the portion of the semiconductor wafer of FIG. 3B following another BEOL contact formation process step according to the method of FIG. 2.

After the protective liner 360 is formed at process 214, a conductor layer 370 can be formed on the protective liner 360 such that it is positioned above the center portion 320 of the substrate 301, filling the first openings 352a-b, and further such that it does not extend laterally over the edge portion 310 of the substrate 301 (216, see FIG. 3F). For example, a tungsten layer can be formed by CVD using tungsten hexafluoride ($WF_6$) gas. However, as a function of the tool used for CVD of tungsten (W), the tungsten (W) layer will be deposited only above the center portion 320 of the substrate 301 and not above the edge portion 310 (e.g., not above the outermost 0.5-2.0 mm portion of the substrate 301 immediately adjacent to the wafer's edge 311). Additionally, $WF_6$ gas 375 may build up near the wafer's edge 311. Thus, during tungsten deposition by CVD at process 214, the additional openings 352a-b above the edge portion 310 of the substrate 101 may be subjected to prolonged exposure to significant amounts $WF_6$ gas 375. If the protective liner 360 was deposited at process 214 such that it does not extend laterally to the wafer's edge 311, then the semiconductor material within any unlined opening 351b will be damaged due to direct exposure to the $WF_6$ gas 375 (e.g., see void 305 created in substrate 301 below the opening 351b). Additionally, even if the protective liner 360 is deposited such that it is above all or some of the edge portion 310 of the substrate 301, prolonged exposure of the protective liner 360 to $WF_6$ gas 375 can damage the protective liner 360 and, in turn, the semiconductor material at the bottom surface of the opening 351a (e.g., see void 305 created in substrate 301 below the opening 351a). As discussed in detail above, such voids 305 can reduce adhesion of the dielectric layers 342 and, particularly, the BPSG layer 340 and without adequate adhesion, the BPSG layer 340 can flake during chemical mechanical polishing (CMP) of the conductor layer 370 or other subsequent processes.

Figure 3G:
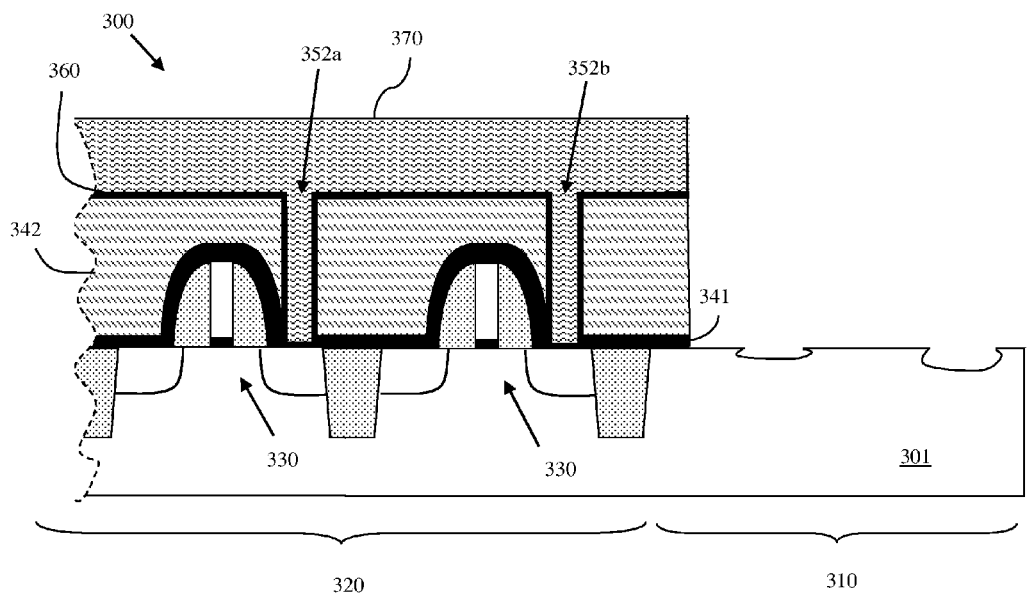
FIG. 3G is a cross-section diagram illustrating the portion of the semiconductor wafer of FIG. 3B following another BEOL contact formation process step according to the method of FIG. 2.

Thus, at this point in the contact formation process of FIG. 2, a preventative etch process can be performed to remove dielectric material which may flake (218, see FIG. 3G). Specifically, during an anisotropic etch process (e.g., a reactive ion etch (RIE) process), the conductor layer 370, which is above the center portion 320 only of the substrate (i.e., which does not extend to the wafer's edge 311), can be used as a mask and the edge portion 310 of the substrate 301 can be exposed. Thus, this anisotropic etch process removes any conductive material (e.g., the protective liner 360) and any dielectric material (e.g., the BPSG layer 342 and the nitride layer 341) from above the edge portion 310 of the substrate 301. It should be understood that multiple discrete selective anisotropic RIE processes may be required to etch through multiple different layers 360 and 341-342 stopping on the substrate 301.

Figure 3H:
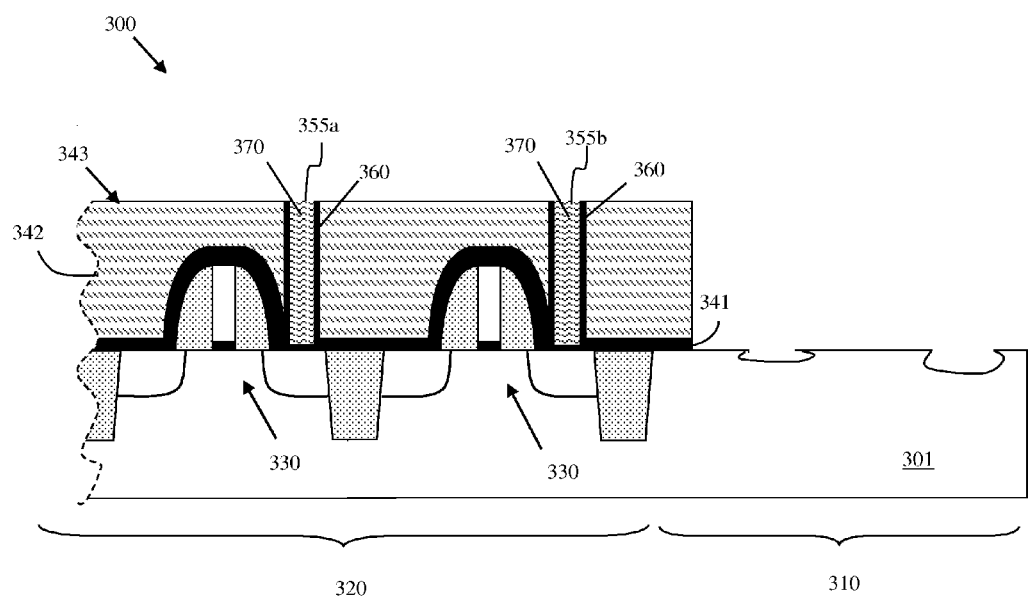
FIG. 3H is a cross-section diagram illustrating the portion of the semiconductor wafer of FIG. 3B with completed contact structures formed according to the method of FIG. 2.

After this etch process 218 is performed, a chemical mechanical polishing (CMP) process can be performed to expose the top surface 343 of the uppermost dielectric layer 342 (e.g., the top surface of the BPSG layer) and complete the contact structures 355a-b (220, see FIG. 3H). Performing the CMP at process 220, only after the dielectric material and, particularly, the BPSG material, has been removed from above the edge portion 110 of the substrate 301 reduces the occurrence of dielectric material flaking (e.g., BPSG flaking) near the wafer's edge 111 and, thereby reduces the occurrence of surface defects.

Following the CMP at process 220, conventional BEOL processing steps may be performed in order to form metal levels above the semiconductor devices 330 (222). Such processing, can include, but is not limited to, the deposition of additional interlayer dielectric material and the formation of wire structures therein in order to interconnect the semiconductor devices 330, as necessary. The details of such BEOL processing are well-known in the art and, thus, are omitted from this specification in order to allow the reader to focus on the salient aspects of the invention.

Figure 4:
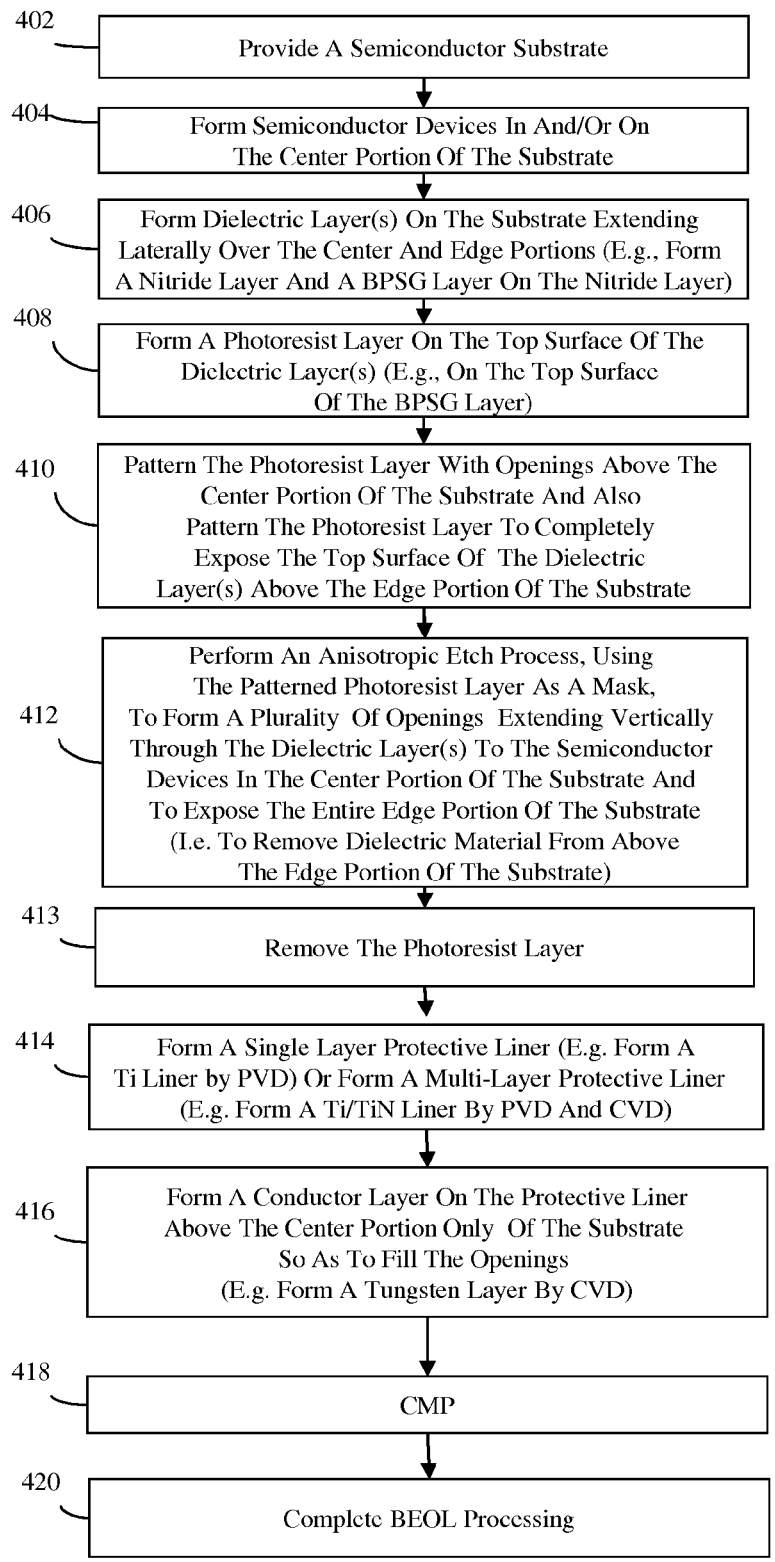
FIG. 4 is a flow diagram illustrating another embodiment of a BEOL contact formation method according to the present invention.
Figure 5A:
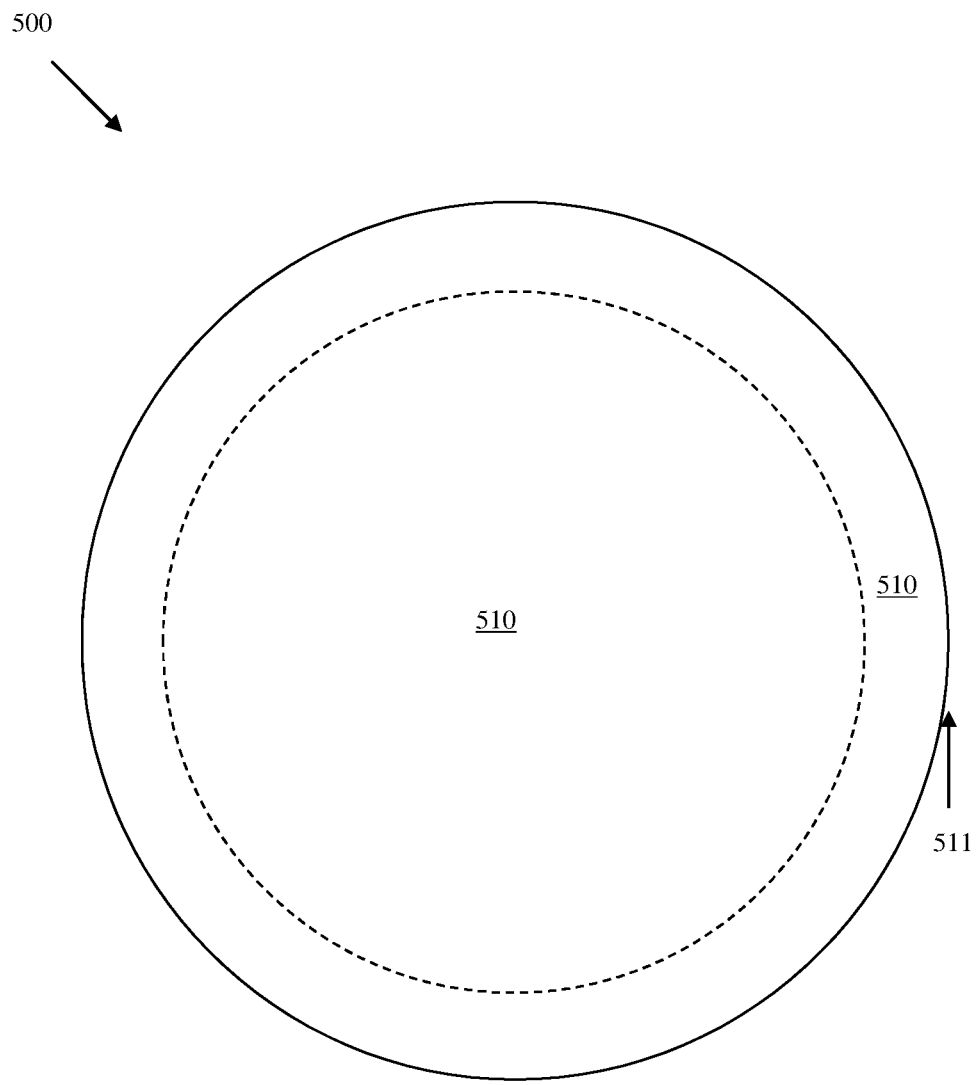
FIG. 5A is a top view diagram illustrating a semiconductor wafer.

Referring to FIG. 4, another embodiment of a contact formation method (e.g., a tungsten contact or tungsten plug formation method) comprises providing a semiconductor wafer 500 (402, see FIG. 5A). This wafer 500 can comprise a semiconductor substrate 501 comprising, for example, a bulk silicon substrate, a silicon-on-insulator (SOI) substrate, or any semiconductor substrate suitable for semiconductor device formation. The substrate 501 can have a center portion 520 and an edge portion 510 positioned laterally around the center portion 520 and extending to the wafer's edge 511. This edge portion 310 can comprise, for example, the outermost 0.5-2.0 mm portion of the substrate 301 immediately adjacent to the wafer's edge 311. Functioning semiconductor devices 530 (e.g., planar field effect transistors (FETs) (as shown), non-planar FETs, bipolar transistors (BTs), heterojunction bipolar transistors (HBTs), diodes, resistors, capacitors, or any other semiconductor device) can be formed in and/or on the center portion 520 only of the substrate 501 (404, see FIG. 3B). Processes for forming such devices 530 on semiconductor wafers are well-known in the art and, thus, the details of such processes are omitted from this specification to allow the reader to focus on the salient aspects of the invention.

Figure 5B:
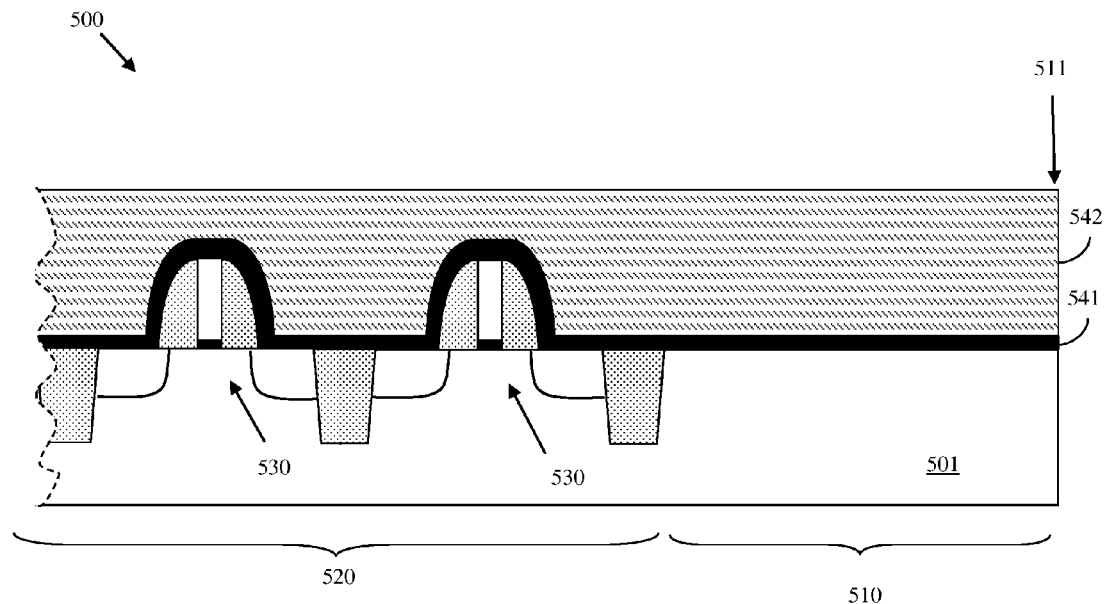
FIG. 5B is a cross-section diagram illustrating a portion of the semiconductor wafer of FIG. 5A prior to BEOL contact formation processing according to the method of FIG. 4.

Next, at least one dielectric layer can be formed above the substrate 501, extending laterally across both the center and edge portions (406, see dielectric layers 541-542 of FIG. 5B). For example, a conformal silicon nitride layer 541 can be formed (e.g., by a low-pressure chemical vapor deposition LPCVD)) on the substrate 501 and a blanket borophosphosilicate glass (BPSG) layer 542 can be formed (e.g., also by LPCVD) on the conformal silicon nitride layer.

Figure 5C:
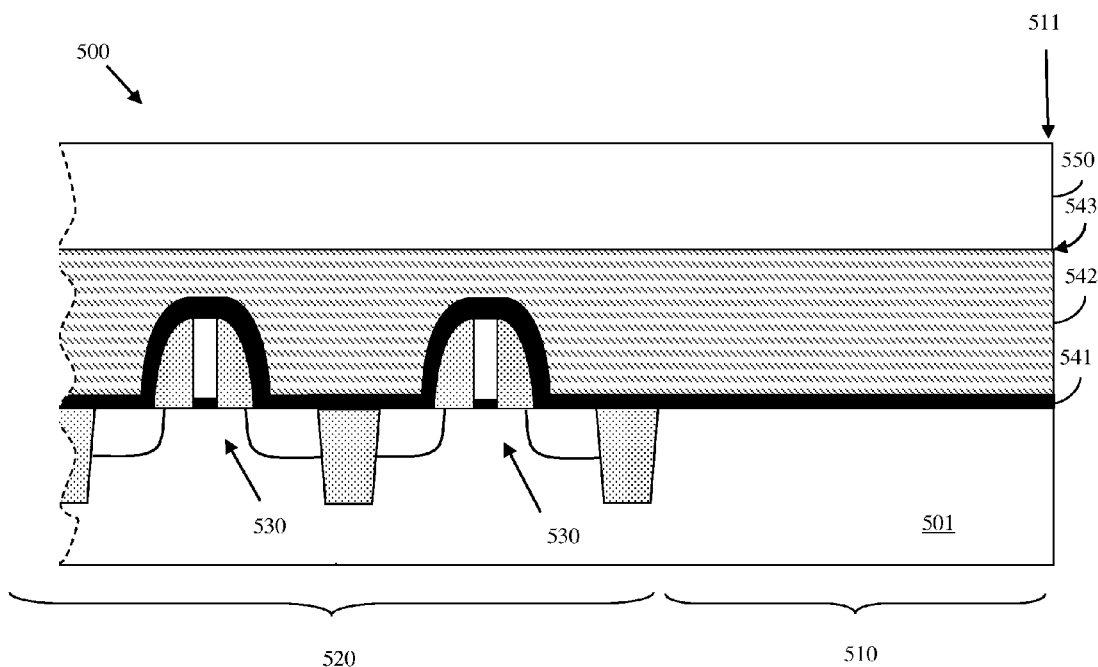
FIG. 5C is a cross-section diagram illustrating the portion of the semiconductor wafer of FIG. 5B following a BEOL contact formation process step according to the method of FIG. 4.
Figure 5D:
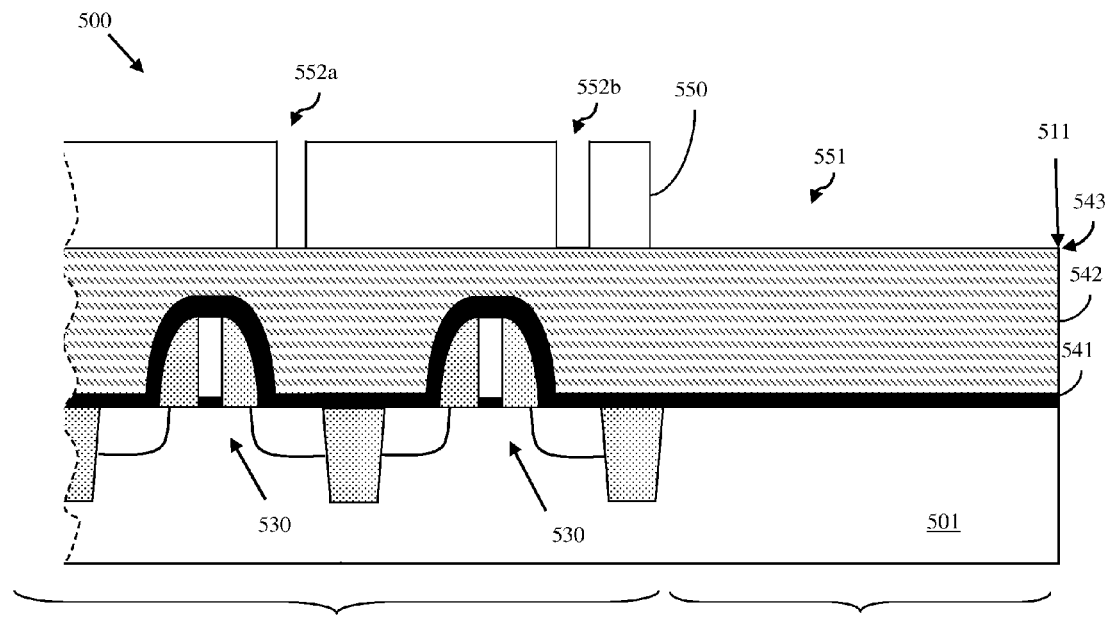
FIG. 5D is a cross-section diagram illustrating the portion of the semiconductor wafer of FIG. 5B following another BEOL contact formation process step according to the method of FIG. 4.

After the dielectric layer(s) are formed at process 406, a photoresist layer 550 can be deposited onto the top surface 543 of the uppermost dielectric layer 542 (e.g., onto the top surface of the BPSG layer 542) (408, see FIG. 5C). The photoresist layer 550 can then be patterned with a plurality of openings 552a-b above the center portion 520 of the substrate 501. These openings 552a-b can be patterned to have diameter corresponding to the desired diameter for the device contacts (e.g., a diameter of 0.05-0.5 microns (μm)). Additionally, the photoresist layer 550 can be patterned so as to expose the top surface 543 of the uppermost dielectric layer 542 (e.g., the top surface of the BPSG layer) above the edge portion 510 of the substrate 501 (410, see FIG. 5D). That is, it can be patterned with an additional opening 551 above the entire outermost 0.5-2.0 mm of the substrate 501 at the wafer's edge 511.

Figure 5E:
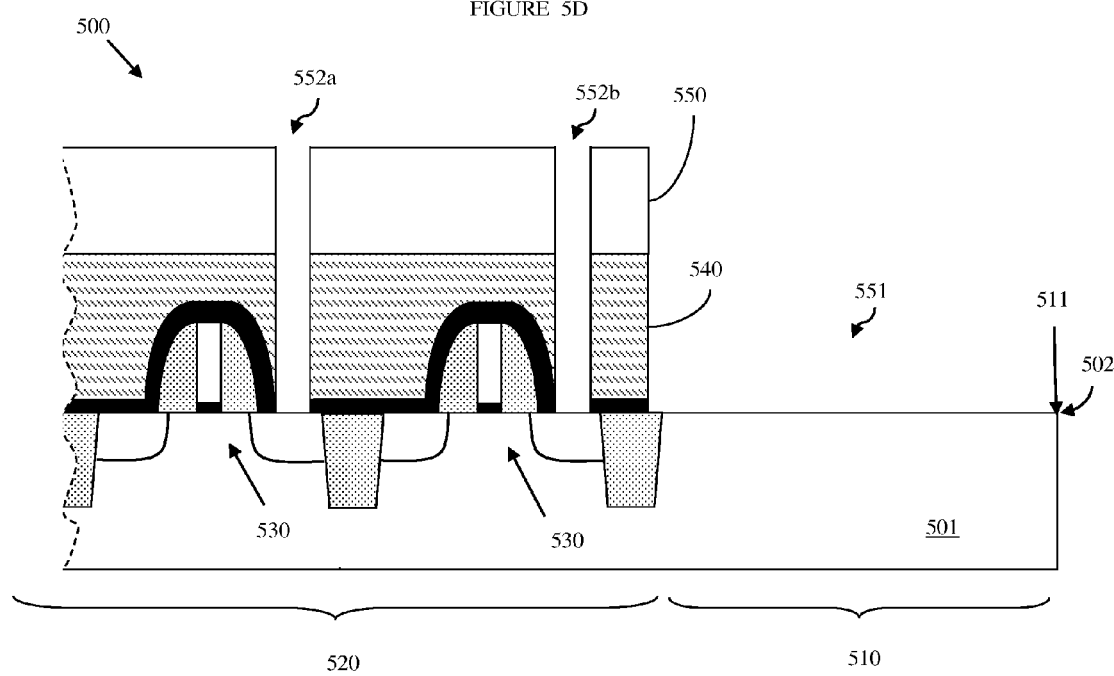
FIG. 5E is a cross-section diagram illustrating the portion of the semiconductor wafer of FIG. 5B following another BEOL contact formation process step according to the method of FIG. 4.

Next, an etch process can be performed (412, see FIG. 5E). Specifically, an anisotropic etch process (e.g., a reactive ion etch (RIE) process) can be performed so as to extend the openings 552a-b through the dielectric layer(s) 541-542 to the semiconductor devices 530 in the center portion 520 of the substrate 501 and to simultaneously extend the opening 551 through the dielectric layer(s) 541-542 and, thereby expose the entire edge portion 510 of the substrate 301 (e.g., the entire outermost 0.5-2.0 mm of the substrate 501 at the wafer's edge 511). It should be understood that multiple selective anisotropic RIE processes may be required to etch through multiple different dielectric layers 541-542 stopping on the substrate 301. Following this etch process 412, the photoresist layer 550 can be selectively removed (413).

Figure 5F:
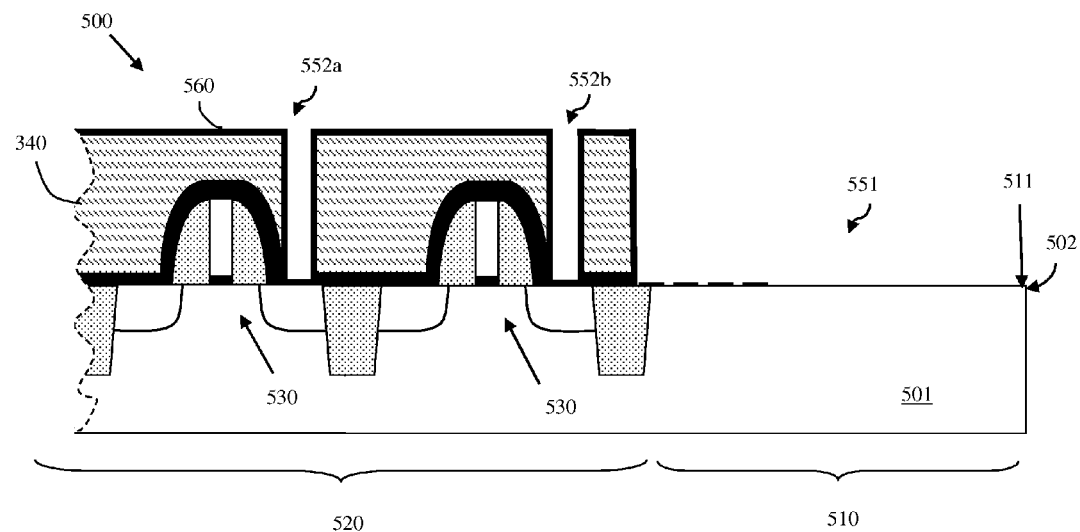
FIG. 5F is a cross-section diagram illustrating the portion of the semiconductor wafer of FIG. 5B following another BEOL contact formation process step according to the method of FIG. 4.

Optionally, after the openings 552a-b are extended through the dielectric layer(s) 541-542 and the photoresist layer is removed at processes 412-413, a protective liner 560 can be formed that lines the openings 552a-b above the center portion 520 of the substrate 501 (414, see FIG. 5F). The process 414 of forming the protective liner 560 can optionally comprise forming a multi-layer protective liner. For example, a titanium layer can be formed (e.g., by plasma vapor deposition (PVD)) on the top surface 543 of the uppermost dielectric layer 542 (e.g., on the top surface of the BPSG layer) and further on the sidewalls and bottom surfaces of the openings 552a-b. This titanium layer can function as an adhesion layer, enhancing adhesion between the dielectric layer(s) 541-542 and a conductor layer which will subsequently fill the openings. Next, a titanium nitride layer can be formed (e.g., by chemical vapor deposition (CVD) on the titanium layer. This titanium nitride layer can function as a diffusion barrier layer. It should be noted that as a function of the tools used to form the liner 560, it may not be uniformly deposited on the exposed top surface 502 of the edge portion 510 of the substrate 501 or extend to the wafer's edge 511.

Figure 5G:
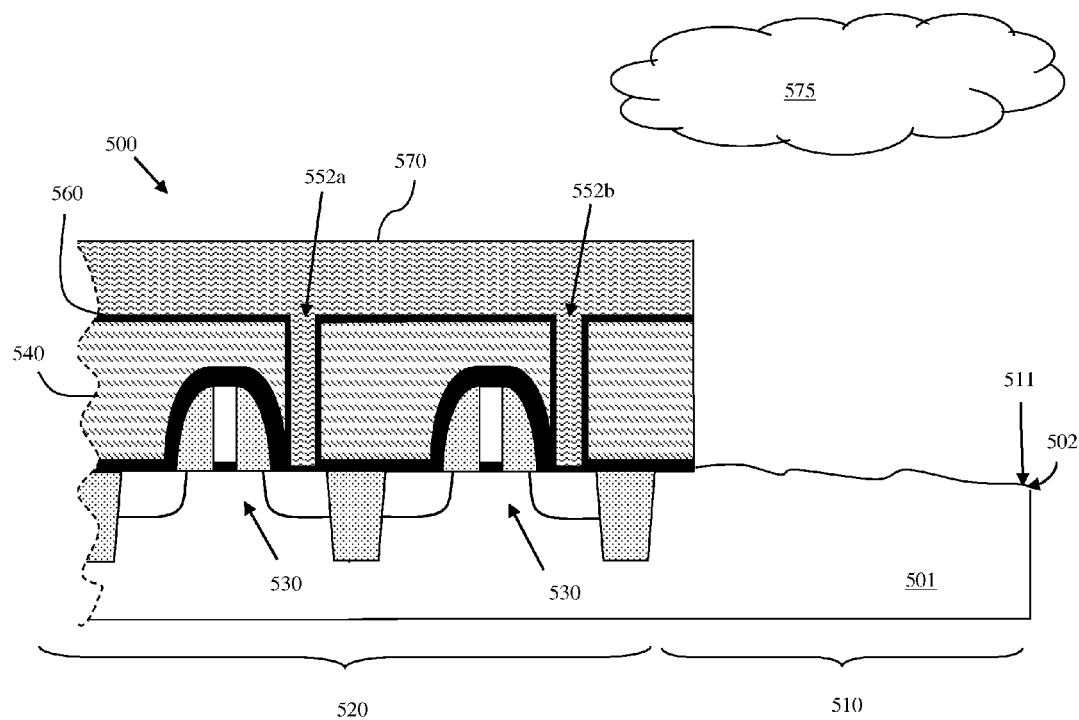
FIG. 5G is a cross-section diagram illustrating the portion of the semiconductor wafer of FIG. 5B following another BEOL contact formation process step according to the method of FIG. 4.

After the protective liner 560 is formed at process 414, a conductor layer 570 can be formed on the protective liner 560 such that it is positioned above the center portion 520 of the substrate 501, filling the openings 552a-b and further such that it does not extend laterally over the edge portion 510 of the substrate 501 (416, see FIG. 5G). For example, a tungsten layer can be formed by CVD using tungsten hexafluoride ($WF_6$) gas. However, as a function of the tool used for CVD of tungsten, the tungsten layer will be deposited only above the center portion 520 of the substrate 501 and not above the edge portion 510 (e.g., not above the outermost 0.5-2.0 mm portion of the substrate 501 immediately adjacent to the wafer's edge 511). During this process $WF_6$ gas 575 may build up near the wafer's edge 511. Even in the presence of a protective liner 560, the $WF_6$ gas 575 may subject the top surface 502 of the edge portion 510 of the substrate 501 to etch damage. However, adhesion of the BPSG layer 540 above this edge portion 510 is no longer an issue such damage is essentially inconsequential. That is, such damage does not result in dielectric material flaking and, particularly, BPSG flaking, near the wafer's edge 511 and, thereby reduces the occurrence of surface defects.

Figure 5H:
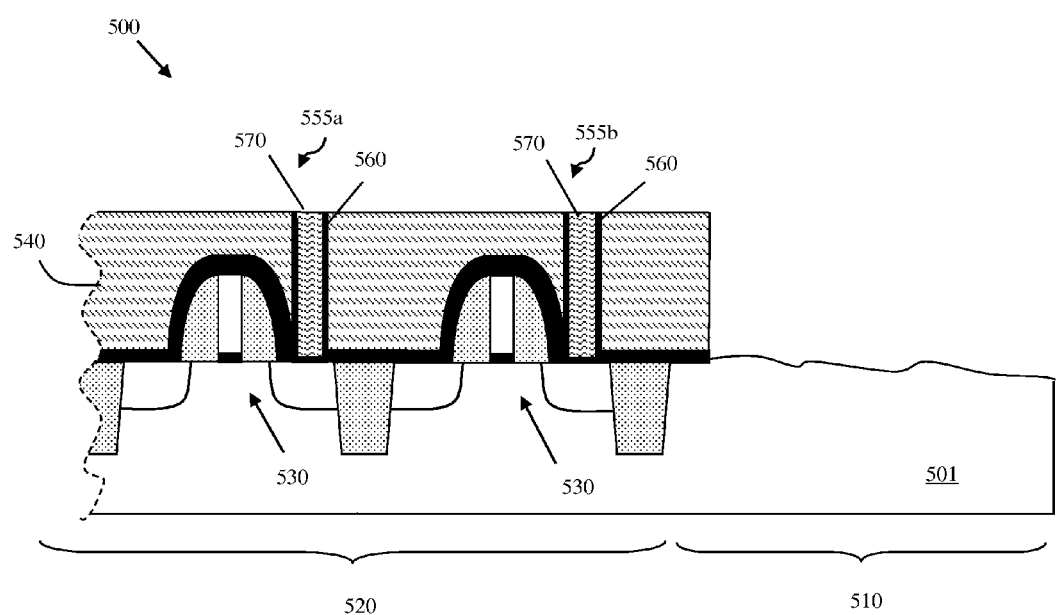
FIG. 5H is a cross-section diagram illustrating the portion of the semiconductor wafer of FIG. 5B with completed contact structures formed according to the method of FIG. 4.

After the conductor layer 570 is deposited, a chemical mechanical polishing (CMP) process can be performed to expose the top surface 543 of the uppermost dielectric layer 542 (e.g., the top surface of the BPSG layer) and complete the contact structures 555a-b (418, see FIG. 5H). Following the CMP at process 418, conventional BEOL processing steps may be performed in order to form metal levels above the semiconductor devices 530 (420). Such processing, can include, but is not limited to, the deposition of additional interlayer dielectric material and the formation of wire structures therein in order to interconnect the semiconductor devices 530, as necessary. The details of such BEOL processing are well-known in the art and, thus, are omitted from this specification in order to allow the reader to focus on the salient aspects of the invention.

It should be understood that the terminology used herein is for the purpose of describing particular embodiments only and is not intended to be limiting of the invention. As used herein, the singular forms "a", "an" and "the" are intended to include the plural forms as well, unless the context clearly indicates otherwise. It should further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Additionally, the corresponding structures, materials, acts, and equivalents of all means or step plus function elements in the claims below are intended to include any structure, material, or act for performing the function in combination with other claimed elements as specifically claimed. Finally, it should be understood that the description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments described were chosen in order to best explain the principles of the invention and the practical application, and to enable others of ordinary skill in the art to understand the invention for various embodiments with various modifications as are suited to the particular use contemplated.

Therefore, disclosed above are embodiments of a contact formation technique that incorporates a preventative etch step to reduce interlayer dielectric material flaking (e.g., borophosphosilicate glass (BPSG) flaking) and, thereby to reduce surface defects. Specifically, contact openings, which extend through dielectric material to semiconductor devices in and/or on the center portion of a substrate, can be filled with a conductor layer (e.g., a tungsten layer) deposited by chemical vapor deposition (CVD). Chemical mechanical polishing (CMP) of the conductor layer can be performed to complete the contact structures. However, before the CMP process is performed (e.g., either before the contact openings are ever formed or before the contact openings are filled), a preventative etch process can be performed to remove any dielectric material from above the edge portion of the substrate. Removing the dielectric material from above the edge portion of the substrate prior to CMP reduces the occurrence of surface defects caused by dielectric material flaking.

The invention claimed is:

1. A contact formation method comprising:
    forming at least one dielectric layer above a substrate, said substrate comprising a center portion and an edge portion positioned laterally around to said center portion;
    forming openings through said at least one dielectric layer to said substrate, said openings comprising a plurality of first openings to said center portion and at least one second opening to said edge portion;

forming a conductor layer on said dielectric layer such that said conductor layer is positioned above said center portion and fills said first openings and further such that said conductor layer does not extending laterally over said edge portion; and performing an etch process, using said conductor layer as a mask, so as to expose said edge portion.

2. The method of claim 1, said forming of said conductor layer comprising depositing said conductor layer by chemical vapor deposition.

3. The method of claim 1, said performing of said etch process comprising performing an anisotropic etch process.

4. The method of claim 1, further comprising, after said performing of said etch process, performing a chemical mechanical polishing process to expose a top surface of said at least one dielectric layer.

5. A contact formation method comprising:
providing a semiconductor substrate, said substrate comprising a center portion and an edge portion positioned laterally around said center portion;
forming semiconductor devices in said center portion;
forming a borophosphosilicate glass (BPSG) layer above said center portion and said edge portion;
forming openings through said borophosphosilicate glass (BPSG) layer to said substrate, said openings comprising a plurality of first openings to said semiconductor devices in said center portion and at least one second opening to said edge portion;
forming a protective liner lining said openings;
forming a tungsten layer on said protective liner such that said tungsten layer is positioned above said center portion and fills said first openings and further such that said tungsten layer does not extending laterally over said edge portion; and
performing an etch process, using said tungsten layer as a mask, so as to expose said edge portion.

6. The method of claim 5, further comprising, before said forming of said borophosphosilicate glass (BPSG) layer, forming a conformal nitride layer on said center portion over said semiconductor devices and further on said edge portion.

7. The method of claim 5, said forming of said protective liner comprising forming a multi-layer protective liner.

8. The method of claim 7, said forming of said multi-layer protective liner comprising depositing a titanium layer by plasma vapor deposition, said titanium layer functioning as an adhesion layer; and depositing a titanium nitride layer by chemical vapor deposition onto said titanium layer, said titanium nitride layer functioning as a barrier layer.

9. The method of claim 5, said forming of said tungsten layer comprising depositing said tungsten layer by chemical vapor deposition, using tungsten hexafluoride ($WF_6$) gas.

10. The method of claim 6, said performing of said etch process comprising performing multiple discrete selective anisotropic etch processes for etching through said protective liner, said borophosphosilicate glass (BPSG) layer and said nitride layer.

11. The method of claim 5, further comprising, after said performing of said etch process, performing a chemical mechanical polishing process to expose a top surface of said borophosphosilicate glass (BPSG) layer.

* * * * *